(12) United States Patent
Raley et al.

(10) Patent No.: US 12,438,006 B2
(45) Date of Patent: Oct. 7, 2025

(54) METAL HARD MASK INTEGRATION

(71) Applicant: Tokyo Electron Limited, Tokyo (JP)

(72) Inventors: Angelique Raley, Albany, NY (US);
Hirokazu Aizawa, Albany, NY (US);
Kaoru Maekawa, Albany, NY (US);
Katie Lutker-Lee, Albany, NY (US);
Gerrit Leusink, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 617 days.

(21) Appl. No.: 17/718,955

(22) Filed: Apr. 12, 2022

(65) Prior Publication Data
US 2023/0260801 A1 Aug. 17, 2023

Related U.S. Application Data

(60) Provisional application No. 63/310,434, filed on Feb. 15, 2022.

(51) Int. Cl.
*H01L 21/321* (2006.01)
*H01L 21/311* (2006.01)
(Continued)

(52) U.S. Cl.
CPC .... *H01L 21/3212* (2013.01); *H01L 21/31116* (2013.01); *H01L 21/31144* (2013.01);
(Continued)

(58) Field of Classification Search
CPC ......... H01L 21/76802; H01L 21/76805; H01L 21/76807; H01L 21/76897;
(Continued)

(56) References Cited

U.S. PATENT DOCUMENTS

| 8,859,430 B2 | 10/2014 | Chiba |
| 10,593,556 B2 | 3/2020 | Yatsuda et al. |

(Continued)

OTHER PUBLICATIONS

Iwasaki et al., "Industrial Challenges of TiN Hard Mask Wet removal process for 14nm technology node", Solid State Phenomena vol. 219 (2015), Trans Tech Publications, Switzerland, doi:10.4028/www.scientific.net/SSP.219.213, pp. 213-216, 5 pages total.

*Primary Examiner* — Jose R Diaz
(74) *Attorney, Agent, or Firm* — Slater Matsil, LLP

(57) ABSTRACT

A method of processing a substrate that includes: etching a recess in the substrate using a metal hard mask (MHM) layer as an etch mask, the substrate including a dielectric layer over a conductive layer the includes a first conductive material, a portion of the MHM layer remaining over top surfaces of the dielectric layer after the etching; depositing a sacrificial fill over the substrate to at least partially fill the recess; removing the remaining portion of the MHM layer to expose the top surfaces while protecting the recess with the sacrificial fill; removing the sacrificial fill from the recess after removing the MHM layer, the removing of the sacrificial fill including exposing a portion of the conductive layer; and depositing a second conductive material to fill the recess, the depositing of the second conductive material providing an electrical connection between the conductive layer and the second conductive material.

20 Claims, 9 Drawing Sheets

(51) Int. Cl.
*H01L 21/3213* (2006.01)
*H01L 21/67* (2006.01)
*H01L 21/768* (2006.01)

(52) U.S. Cl.
CPC .. *H01L 21/32136* (2013.01); *H01L 21/32139* (2013.01); *H01L 21/67167* (2013.01); *H01L 21/67184* (2013.01); *H01L 21/67207* (2013.01); *H01L 21/76802* (2013.01); *H01L 21/76805* (2013.01); *H01L 21/76808* (2013.01); *H01L 21/76814* (2013.01); *H01L 2221/1063* (2013.01)

(58) Field of Classification Search
CPC ....... H01L 21/02063; H01L 2221/1063; H01L 21/31144; H01L 21/67167; H01L 21/67184; H01L 21/67207; H01L 21/76814
See application file for complete search history.

(56) References Cited

U.S. PATENT DOCUMENTS

| | | | |
|---|---|---|---|
| 10,861,739 B2 | 12/2020 | Kikuchi et al. | |
| 10,950,442 B2 | 3/2021 | Kikuchi et al. | |
| 10,978,300 B2 | 4/2021 | Kikuchi et al. | |
| 2008/0318411 A1* | 12/2008 | Tsutsue | H01L 21/76808 257/E21.295 |
| 2016/0079115 A1* | 3/2016 | Lee | H01L 21/76811 438/637 |
| 2019/0385903 A1* | 12/2019 | Kikuchi | H01L 21/31144 |

* cited by examiner

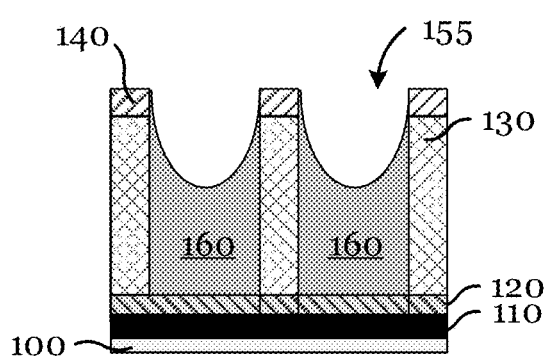
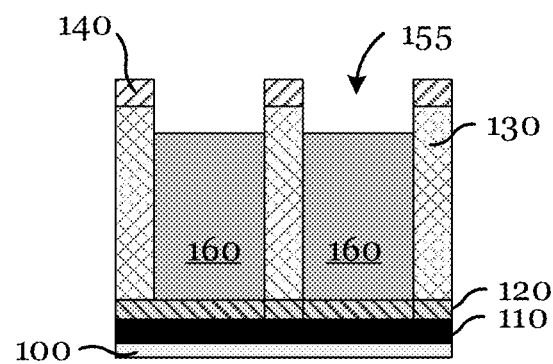
FIG. 2A
FIG. 2B

METAL HARD MASK INTEGRATION

CROSS-REFERENCE TO RELATED APPLICATIONS

This application claims the benefit of U.S. Provisional Application No. 63/310,434, filed on Feb. 15, 2022 which application is hereby incorporated herein by reference.

TECHNICAL FIELD

The present invention relates generally to a system and method of processing a substrate, and, in particular embodiments, to metal hard mask integration.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Processing flows used to form the constituent structures of semiconductor devices involve depositing and removing a variety of materials. For these purposes, various plasma processes are often used in semiconductor device fabrication.

Plasma etching, a type of plasma processes, is a common technique to etch materials by exposing them to a plasma of a gas comprising charged species, neutral species, or combination thereof. To perform area-specific plasma etching for patterning, an etch mask is commonly used so that the etchant can reach to only areas that are not masked. The etch mask must therefore be more stable than target materials to be etched under the plasma etching condition. At the same time, it is often necessary to remove the remaining etch mask after the plasma etching for successful semiconductor device manufacturing.

SUMMARY

In accordance with an embodiment of the present invention, a method of processing a substrate that includes: etching a recess in the substrate using a metal hard mask layer as an etch mask, the substrate including a dielectric layer over a conductive layer, the conductive layer including a first conductive material, a portion of the metal hard mask layer remaining over top surfaces of the dielectric layer after the etching; depositing a sacrificial fill over the substrate to at least partially fill the recess; removing the remaining portion of the metal hard mask layer to expose the top surfaces, the sacrificial fill protecting the recess when removing the remaining portion of the metal hard mask layer; removing the sacrificial fill from the recess after removing the metal hard mask layer, the removing of the sacrificial fill including exposing a portion of the conductive layer; and depositing a second conductive material to fill the recess, the depositing of the second conductive material providing an electrical connection between the conductive layer and the second conductive material.

In accordance with an embodiment of the present invention, a method of processing a substrate that includes: etching a recess in the substrate using a hard mask layer as an etch mask, the substrate including a dielectric layer over a conductive layer, the conductive layer including a first conductive material; depositing a sacrificial fill over the substrate to at least partially fill the recess; removing the hard mask layer by a first chemical mechanical planarization process (CMP); removing the sacrificial fill from the recess; depositing a second conductive material to fill the recess, the depositing of the second conductive material providing an electrical connection between the conductive layer and the second conductive material; and planarizing the second conductive material by a second CMP.

In accordance with an embodiment of the present invention, a cluster tool for processing a substrate that includes: a first processing chamber configured to deposit a sacrificial fill, the first processing chamber including: a first vacuum pumping system; a first gas injection system configured to deliver a deposition gas including a monomer to form a thermally depolymerizable polymer, the thermally depolymerizable polymer being used to form the sacrificial fill; and a first substrate holder configured to hold the substrate; a second processing chamber configured to etch a hard mask including a metal, the second processing chamber including; a second vacuum pumping system; a second gas injection system configured to deliver an etch gas; and a second substrate holder configured to hold the substrate; a transfer mechanism configured to transfer the substrate between the first processing chamber and the second processing chamber; one or more processors; and a memory having a program to be executed in the one or more processors and including instructions to: position the substrate in the first processing chamber, the substrate including a dielectric material with a recess and the hard mask positioned over top surfaces of the dielectric material; in the first processing chamber, deposit the sacrificial fill to at least partially fill the recess; using the transfer mechanism, transfer the substrate from the first processing chamber to the second processing chamber; in the second processing chamber, etch the hard mask by a dry etch process using the etch gas; and in the second processing chamber, heating the substrate to remove the sacrificial fill.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1K illustrate cross sectional views of an example substrate during an example damascene process comprising removing a hard mask layer at various stages in accordance with various embodiments, wherein FIG. 1A illustrates an incoming substrate, FIG. 1B illustrates the substrate after a dielectric etch to form recesses, FIG. 1C illustrates the substrate after partially filling the recesses with a sacrificial fill, FIG. 1D illustrates the substrate after filling the recess with the sacrificial fill up to the hard mask layer, FIG. 1E illustrates the substrate after overfilling with the sacrificial fill, FIG. 1F illustrates the substrate after removing the hard mask layer, FIG. 1G illustrates the substrate after removing the sacrificial fill, FIG. 1H illustrates the substrate after removing an etch stop layer to expose a portion of a conductive layer, FIG. 1I illustrates the substrate after a diffusion barrier layer deposition, FIG. 1J illustrates the substrate after filling the recess with a conductive material (metallization), and FIG. 1K illustrates the substrate after a planarization process;

FIGS. 2A and 2B illustrate cross sectional views of an example substrate during an optional annealing process as a part of the damascene process illustrated in FIGS. 1A-1K in accordance with an embodiment, wherein FIG. 2A illustrates the substrate before the optional annealing process and FIG. 2B illustrates the substrate after the optional annealing process;

FIGS. 3A-3C illustrate cross sectional views of an example substrate during an example damascene process comprising removing a hard mask layer at various stages in accordance with alternate embodiments, wherein FIG. 3A illustrates another incoming substrate where the etch stop layer is already removed at the bottom of the recesses, FIG. 3B illustrates the substrate after partially filling the recesses with the sacrificial fill, and FIG. 3C illustrates the substrate after removing the hard mask layer;

FIGS. 4A-4C illustrate process flow charts of methods of removing a hard mask in accordance with various embodiments, wherein FIG. 4A illustrates an embodiment, FIG. 4B illustrates an alternate embodiment, and FIG. 4C illustrates yet another embodiment;

DETAILED DESCRIPTION OF ILLUSTRATIVE EMBODIMENTS

This application relates to a method of processing a substrate, more particularly to metal hard mask integration in back end of line (BEOL) process. In a typical BEOL process, a hard mask is used as an etch mask during a dielectric etch to form recesses (e.g., trenches and/or vias). Before performing subsequent steps of the BEOL process such as metallization to form metal interconnects, the remaining portion of the hard mask after the dielectric etch needs to be removed without damaging other device components and features. However, selectively removing the hard mask can be a significant challenge in semiconductor device fabrication. In particular, some new metal hard mask such as tungsten (W)-based hard masks cannot be selectively removed by conventional etch methods. Therefore, a new method for metal hard mask integration may be desired. Embodiments of the present application disclose methods of selective hard mask removal assisted by a sacrificial fill, which is referred to as fill-assisted hard mask removal in this disclosure.

The methods described in this disclosure may advantageously enables the integration of new metal hard mask, including but not limited to tungsten-based masks, in back end of line (BEOL) process with minimal additional steps for selective had mask removal. Using the sacrificial fill to fill recesses before removing the hard mask, the dielectric materials and conductive materials of the semiconductor device may be protected during the hard mask removal. In addition, by sufficient hard mask removal, the method of fill-assisted hard mask removal may enables using new metal hard mask and forming metal interconnects without defect at advanced nodes (e.g., pitch<24 nm). Advantageously, various embodiments may be performed in a single cluster tool, thus not compromising the process efficiency. Further, using a thermally decomposable polymer for the sacrificial fill, the methods herein may advantageously enable the removal of the sacrificial fill by a simple thermal treatment.

Figure 4A:
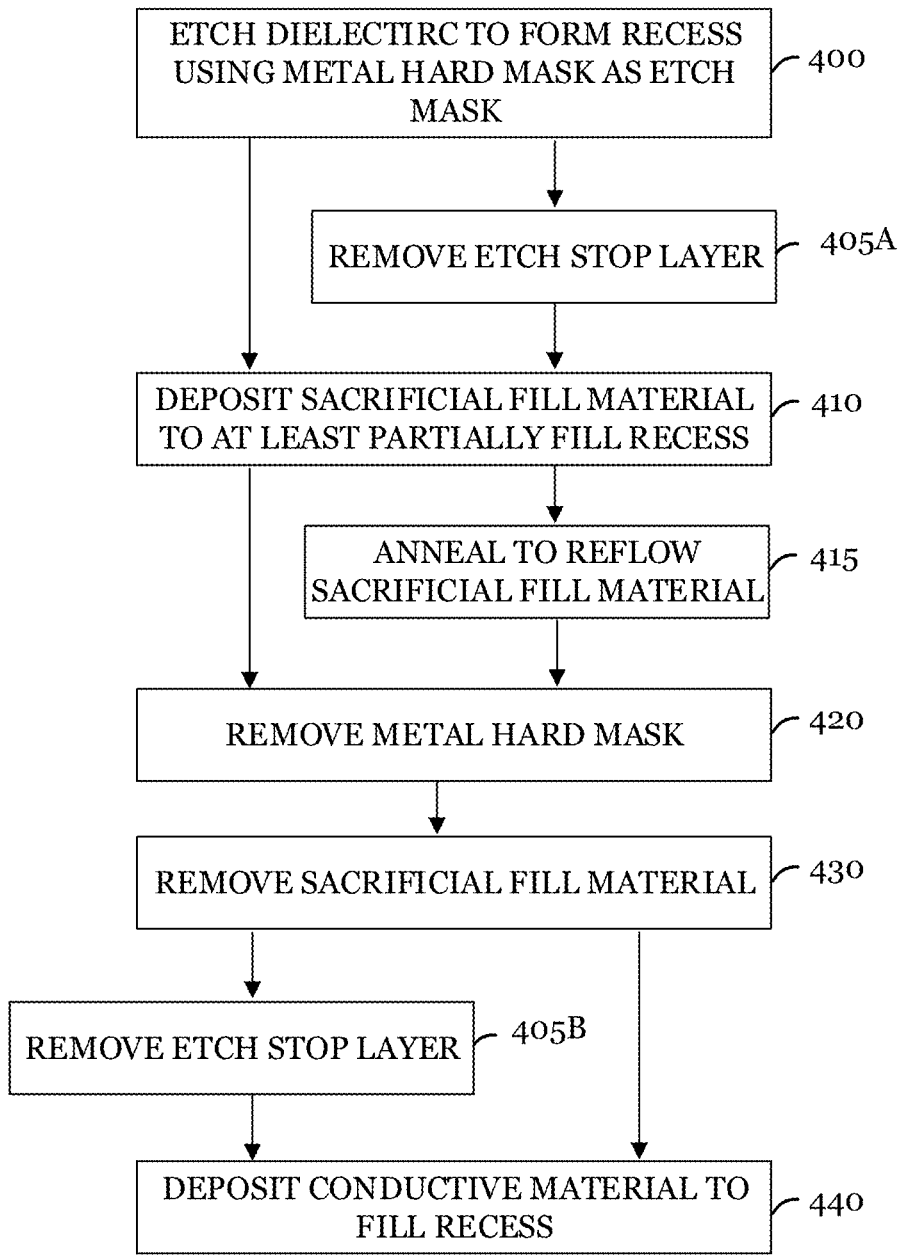
Figure 4B:
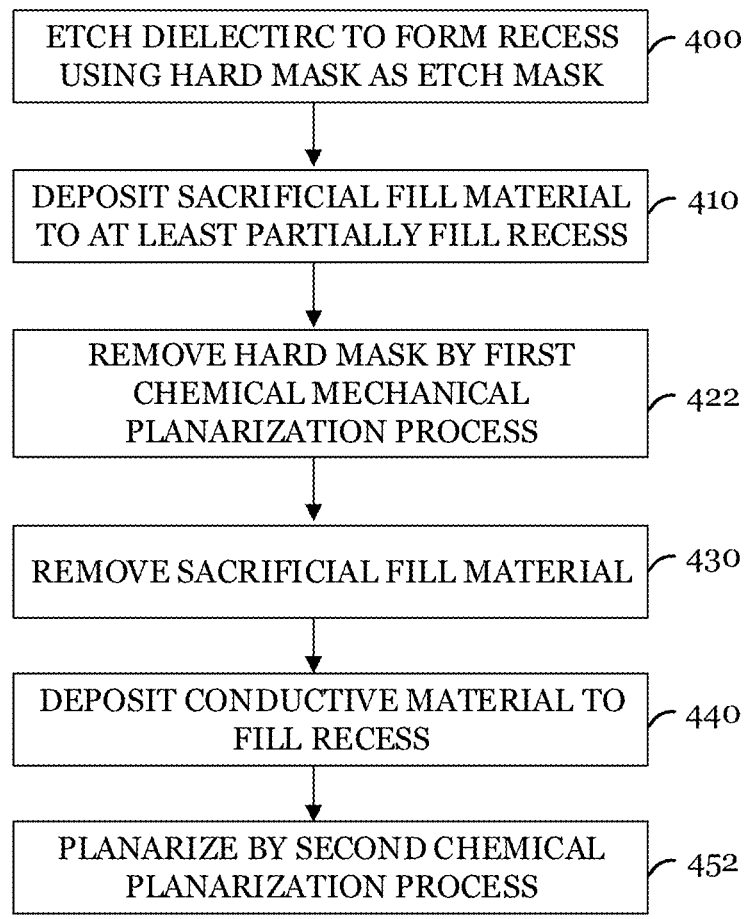
Figure 4C:
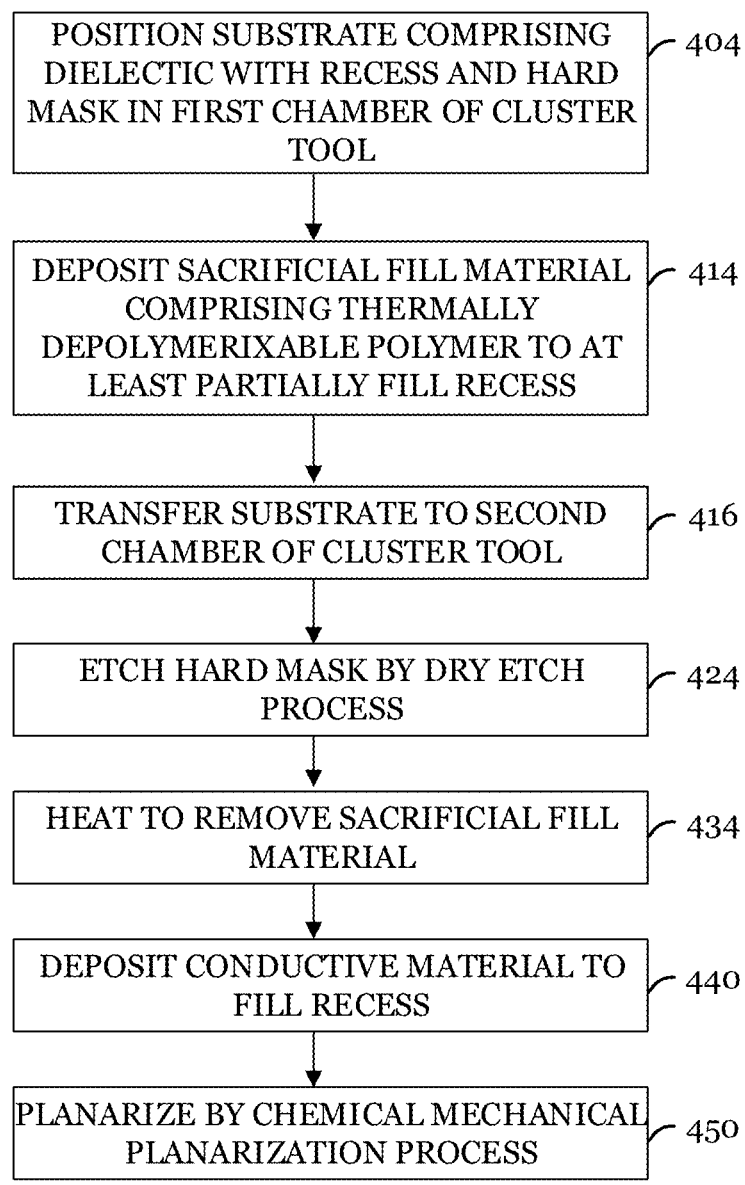
Figure 5:
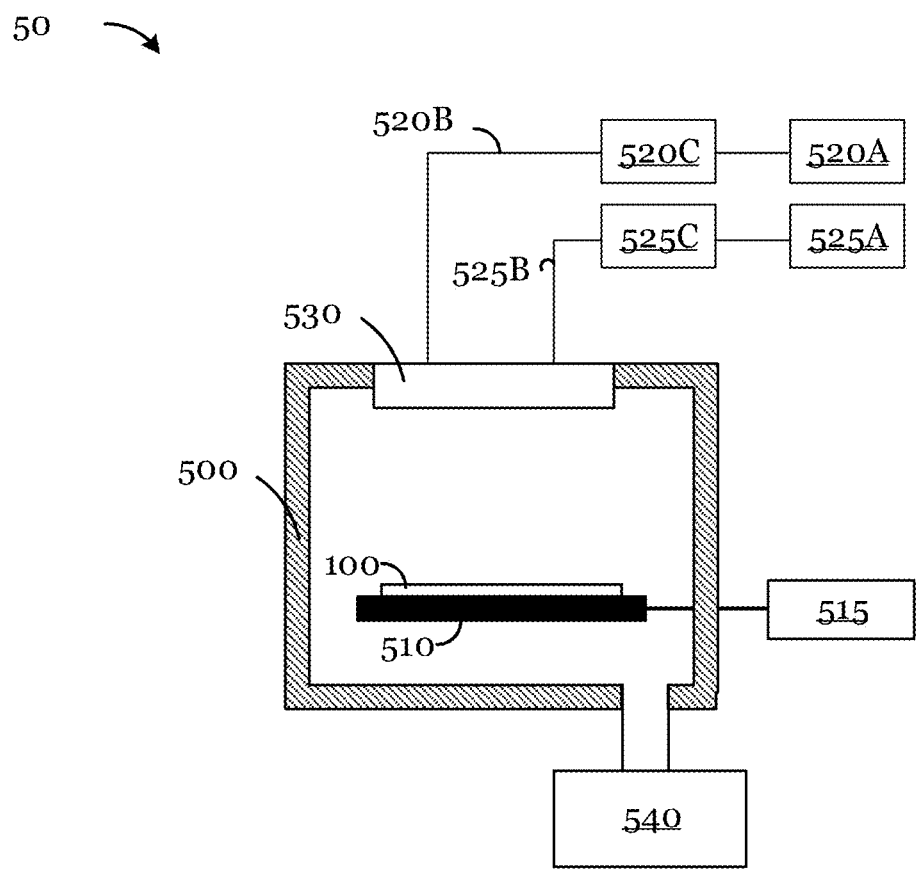
FIG. 5 illustrates a system for depositing a sacrificial fill in accordance with various embodiments.
Figure 6:
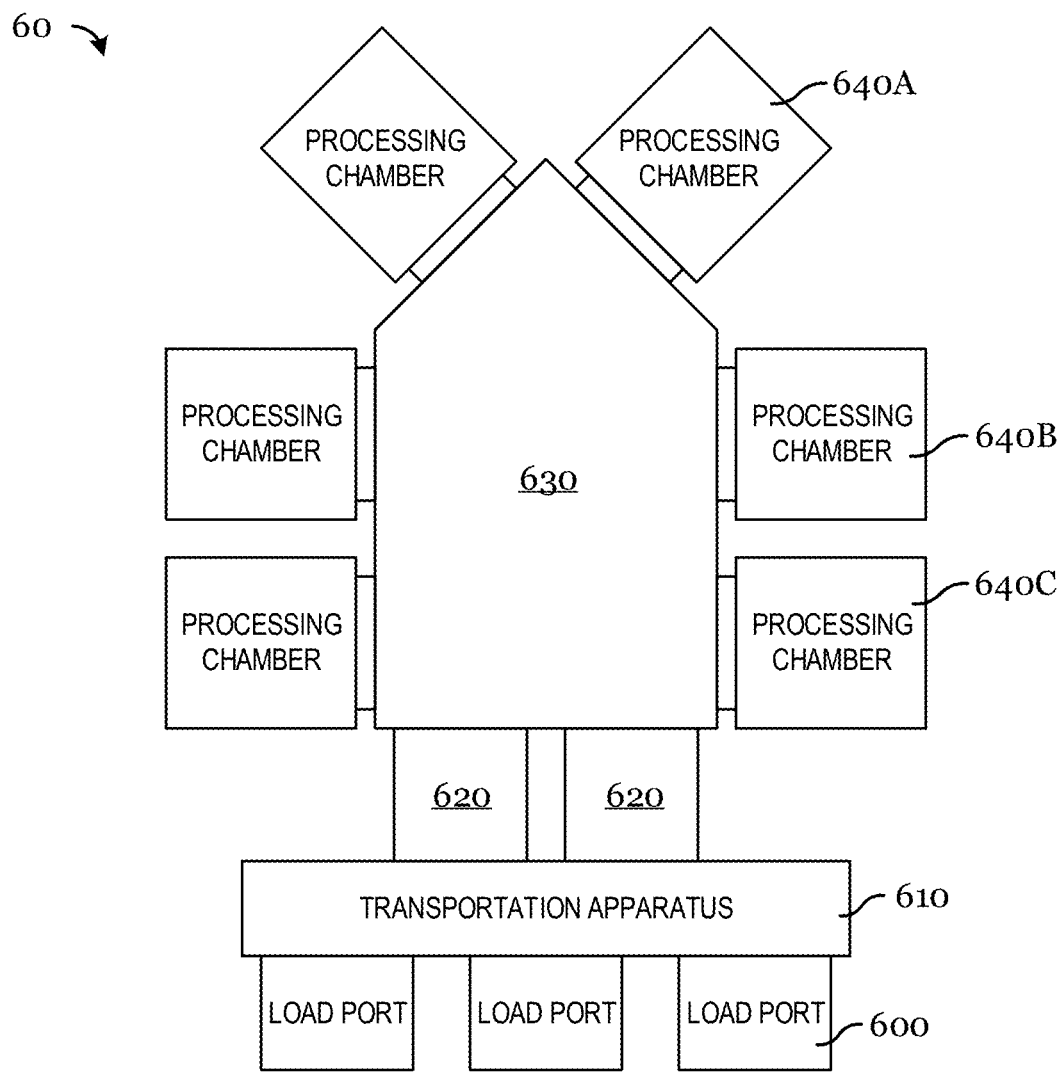
FIG. 6 illustrates a semiconductor cluster tool for performing a process of semiconductor fabrication in accordance with various embodiments.

In the following, steps of a damascene process comprising a fill-assisted hard mask removal are first described referring to FIGS. 1A-1K in accordance with various embodiments. An optional annealing process of the fill-assisted hard mask removal is also described referring to FIGS. 2A and 2B together with FIGS. 1C-1E. Another embodiment of a damascene process is then described in FIGS. 3A-3C. Example process flow diagrams are illustrated in FIG. 4A-4C. FIGS. 5 and 6 provide an example system for depositing a sacrificial fill and a cluster tool to perform the fill-assisted hard mask removal, respectively. All figures in this disclosure are drawn for illustration purpose only and not to scale, including the aspect ratios of features. Although the description below in this disclosure is mainly for single-damascene process, the methods herein may also be applied to dual-damascene process and any other fabrication processes where the hard mask removal may be required.

FIGS. 1A-1K illustrate cross sectional views of an example substrate during an example damascene process comprising removing a hard mask layer at various stages in accordance with various embodiments.

Figure 1A:
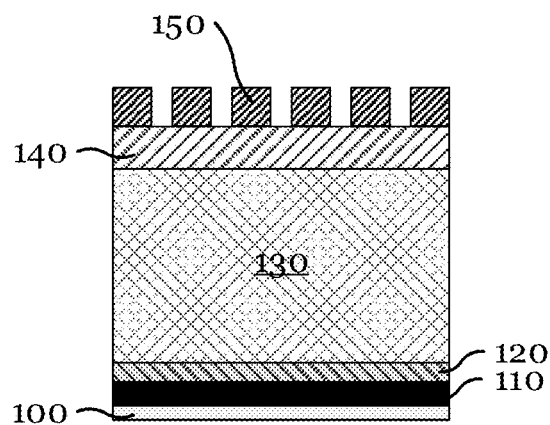

FIG. 1A illustrates a cross-sectional view of an incoming substrate 100. In various embodiments, the substrate 100 may be a part of semiconductor device, and may have undergone a number of steps of processing following, for example, a conventional process. The substrate 100 accordingly may comprise layers of semiconductors useful in various microelectronics. For example, the semiconductor structure may comprise the substrate 100 in which various device regions are formed.

In one or more embodiments, the substrate 100 may be a silicon wafer, or a silicon-on-insulator (SOI) wafer. In certain embodiments, the substrate 100 may comprise a silicon germanium wafer, silicon carbide wafer, gallium arsenide wafer, gallium nitride wafer and other compound semiconductors. In other embodiments, the substrate 100 comprises heterogeneous layers such as silicon germanium on silicon, gallium nitride on silicon, silicon carbon on silicon, as well layers of silicon on a silicon or SOI substrate. In various embodiments, the substrate 100 is patterned or embedded in other components of the semiconductor device.

As illustrated in FIG. 1A, the substrate 100 may further comprises a conductive layer 110 formed over the substrate 100. In some embodiments, there may be one or more layers such as dielectric layers between the substrate 100 and the conductive layer 110. In various embodiments, the conductive layer 110 may be formed as a part of metal interconnects patterned over the substrate 100. In various embodiments, the conductive layer 110 may comprise copper (Cu), aluminum (Al), doped polysilicon, tungsten, titanium nitride, tantalum nitride, ruthenium, and other metals. The conductive layer 110 may be formed by deposition using, for example, a physical vapor deposition (PVD).

Over the conductive layer 110, a dielectric layer may be deposited as an etch stop layer (ESL) 120. In various embodiments, the ESL 120 may comprise silicon carbide, silicon nitride, other silicon-based materials, aluminum oxide, aluminum nitride, or zirconium oxide. The ESL 120 may be deposited using deposition techniques such as vapor deposition including chemical vapor deposition (CVD), physical vapor deposition (PVD), and atomic layer deposition (ALD), as well as other plasma processes such as plasma enhanced CVD (PECVD), sputtering, and other processes. In certain embodiments, the thickness of the ESL 120 may be between 2 nm to 5 nm.

In one embodiment, the ESL 120 may be sandwiched by a top blocking layer and a bottom blocking layer. The blocking layers may comprise a silicon-based dielectric material such as silicon nitride and silicon carbon nitride (SiCN). In this disclosure, the blocking layers, if any, are regarded as a part of the ESL 120 illustrated in FIG. 1A.

Over the etch stop layer (ESL) 120, another dielectric layer may be formed as an interlevel dielectric (ILD) layer 130. The ILD layer 130 may comprise a silicon-based dielectric material with a low dielectric constant (i.e., low-k value) such as organosilicate glass (SiCOH), dense SiCOH, porous SiCOH, and other porous dielectric materials. The ILD layer 130 may be deposited using deposition techniques such as vapor deposition including chemical vapor deposition (CVD), physical vapor deposition (PVD), and atomic layer deposition (ALD), as well as other plasma processes such as plasma enhanced CVD (PECVD), sputtering, and other processes. The ILD layer 130 is a layer that is to be patterned into one or more features, as described further below (e.g., FIG. 1B). The feature being etched into the ILD layer 130 may be any suitable feature. For example, although this disclosure primarily describes "recesses" with respect to the figures of this disclosure, it will be appreciated that other suitable features might be formed in a semiconductor layer, including (whether or not considered "recesses") lines, holes, trenches, vias, and/or other suitable structures, using embodiments of this disclosure.

As further illustrated in FIG. 1A, a hard mask 140 may be formed over the interlevel dielectric (ILD) layer 130. In various embodiments, the hard mask 140 may comprise a metal. In certain embodiments, the hard mask 140 may comprise titanium nitride, titanium, tantalum nitride, tantalum, tungsten silicide, tungsten carbide, other tungsten based materials including tungsten nitride, ruthenium based compounds, aluminum based compounds, zirconium based compounds, or boron based compounds. In further embodiments, the hard mask 140 may be a stacked hard mask comprising, for example, two or more layers using two different materials. As one example, a first layer of the hard mask 140 may comprise a metal-based layer and a second layer of the hard mask 140 may comprise a dielectric layer such as silicon dioxide, silicon nitride, silicon oxynitride, silicon carbide, amorphous silicon, or polycrystalline silicon. The hard mask 140 may be deposited using deposition techniques such as vapor deposition including chemical vapor deposition (CVD), physical vapor deposition (PVD), and atomic layer deposition (ALD), as well as other plasma processes such as plasma enhanced CVD (PECVD), sputtering, and other processes.

Over the hard mask 140, a photoresist 150 may be deposited. In various embodiments, the photoresist 150 may comprise a light sensitive organic material, and may be applied over the hard mask 140 from a solution by, for example, a conventional spin coating technique. As illustrated in FIG. 1A, the photoresist 150 may be patterned with a pattern using a conventional photolithographic technique. In various embodiments, the pattern of the photoresist 150 may be used for forming recesses.

Figure 1B:
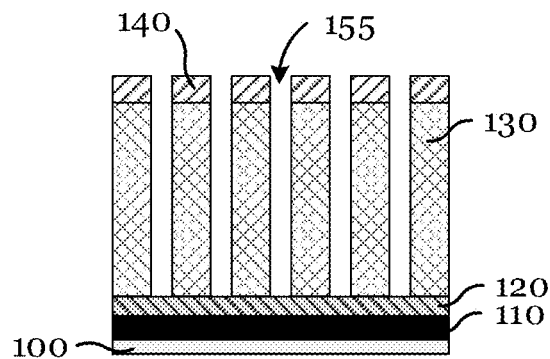

FIG. 1B illustrates the substrate after a dielectric etch to form recesses 155.

In FIG. 1B, the pattern of the photoresist 150 in FIG. 1A is transferred to the ILD layer 130 by the dielectric etch using the hard mask 140 as an etch mask. The dielectric etch anisotropically removes the portion of the hard mask 140 and the ILD layer 130 that were not masked. As illustrated in FIG. 1B, the dielectric etch may be stopped when the etch stop layer (ESL) 120 is exposed in certain embodiments. In alternate embodiments, the dielectric etch may also removes the ESL 120 to expose the conductive layer 110 as described more below referring to FIGS. 2A-2C. An ESL may be used to stop the dielectric etch but in some embodiments, a timed etch may also be used. In certain embodiments, the dielectric etch comprises one or more wet etch processes, plasma etch processes, reactive ion etch (RIE) processes, or combinations of these or other etch processes. Any residue of the photoresist 150 after the dielectric etch may be removed from the substrate 100 by, for example, a conventional plasma ashing technique.

In various embodiments, the recesses 155 may comprise a recess having a width between 8 nm to 300 nm. In certain embodiments, the width may be between 8 nm to 40 nm. In further embodiments, the aspect ratio of a recess (i.e., the height-to-width ratio) of the recesses 155 may be between 2 to 10. In various embodiments, the recesses 155 have critical dimensions required during a back end of line (BEOL) process for a semiconductor device at advanced nodes (e.g., pitch<24 nm). Although each of the recesses 155 is illustrated to have the same width with the same pitch to each other in FIG. 1B, in other embodiments, the recesses 155 may comprise recesses with more than one pitch and/or critical dimension.

Figure 1C:
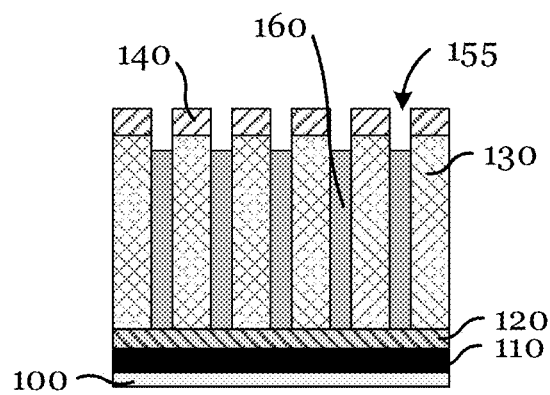

FIG. 1C illustrates the substrate 100 after partially filling the recesses 155 with a sacrificial fill 160.

Before removing the hard mask 140, the recesses 155 are at least partially filled with the sacrificial fill 160 so that the dielectric material of the interlevel dielectric (ILD) layer 130 and the ESL 120 are protected by the sacrificial fill 160 during a subsequent hard mask removal step. The sacrificial fill 160 may comprise a thermal decomposition material. In one embodiment, the thermal decomposition material may be comprised of an ashing-less carbon (ALC) material such as urea binding resin, specifically polyurea, which has characteristics that it can be removed by thermal treatment of less than 400° C. The techniques for forming the polyurea include, but are not limited to, copolymerizing isocyanate and amine as raw material monomers to form a urea bond, for example, using a vapor deposition polymerization process. A liquid process may also be used to form the polyurea. It will be recognized, however, that other formation processes and other removal processes may be utilized. Further, it will be recognized that the techniques described herein are not limited to polyurea and other materials and/or combinations or variants of polyurea and other materials may be utilized as the thermal decomposition material. In an alternate embodiment, the thermal decomposition material may be comprised of polypyrrole, i.e., a polymer derived from pyrrole ($C_4H_4NH$) as a monomer. In yet another embodiment, the sacrificial fill 160 may comprise an oxide.

Advantageously, the sacrificial fill 160 may be deposited from the bottom conformally without clogging the openings of the recesses 155. In particular, when using ALC material for the sacrificial fill 160, a highly conformal deposition and seamless filing of the recesses 155 may be enabled.

In certain embodiments, a vapor deposition polymerization process to form the ALC material may be performed at a temperature between 40° C. to 150° C., or in one embodiment between 70° C. to 100° C. In various embodiments, the process temperature for the vapor deposition polymerization process may be selected based on the types of raw material monomers and/or their respective vapor pressures. For example, when the vapor pressures of the raw material monomers are relatively low, the process temperature may be relatively high, whereas when the vapor pressures of the raw material monomers are relatively high, the process temperature may be relatively low.

Figure 1D:
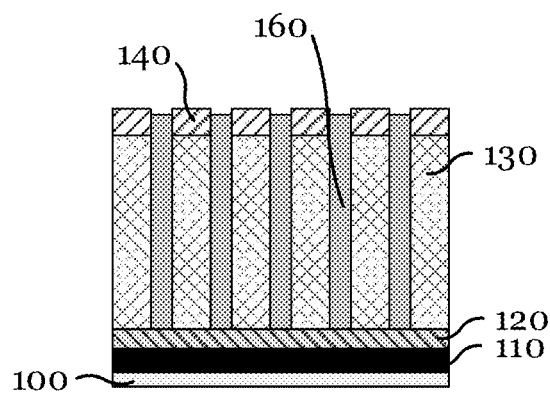
Figure 1E:
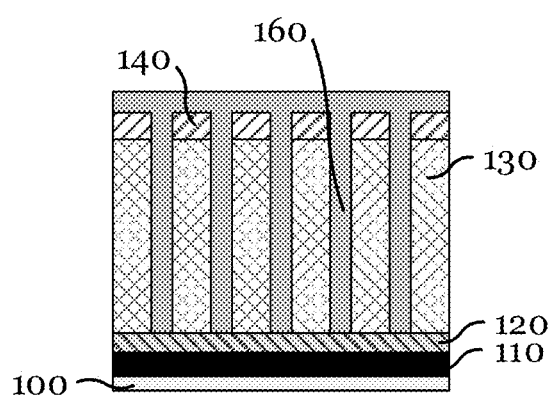
Figure 1F:
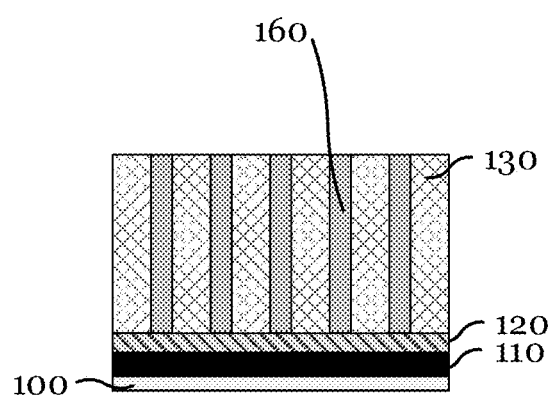

Still referring to FIG. 1C, in certain embodiments, when the sacrificial fill 160 fills at least 80% of the height of the recesses 155, and a subsequent hard mask removal step may be performed (e.g., FIG. 1F). Alternatively, the deposition of the sacrificial fill 160 may be continued to deposit more materials as illustrated in FIGS. 1D and 1E before the hard mask removal step. In one embodiment, an 80% filling of the recess 155 by the sacrificial fill 160 may be completed in less than 5 min.

FIG. 1D illustrates the substrate after filling the recesses 155 with the sacrificial fill 160 up to the hard mask 140, and FIG. 1E illustrates the substrate after overfilling in various alternate embodiments.

In some embodiments, the deposition of the sacrificial fill 160 may be continued so that the sacrificial fill 160 reaches to the level of the hard mask 140 (FIG. 1D) or even overfills the entire portion of the recesses 155 (FIG. 1E). As a result, no sidewall of the interlevel dielectric (ILD) layer 130 is exposed. A hard mask removal step may then be performed. Covering the entire sidewalls of the ILD layer 130 may be beneficial to minimize the loss of the ILD layer 130 during the subsequent hard mask removal step.

One advantage of using a thermal decomposition material for the sacrificial fill 160 is the ability to remove the sacrificial fill 160 from the substrate only by heating. Applying sufficient heat, the thermal decomposition material may decompose and escape into vapor from the substrate. This removal process therefore may be performed without requiring a harsh etch treatment that may cause damage to other portions of the substrate (e.g., ILD layer 130).

Based on this characteristic of the thermal decomposition material, in further embodiments, an optional annealing treatment may be performed to reflow or partially remove the sacrificial fill 160 prior to the hard mask removal step. The optional annealing treatment may be performed by heating the substrate to a temperature between 200° C. to 350° C. in vacuum or under a flow of inert gas in certain embodiments. In another embodiment, the process temperature of the optional annealing treatment may be between 250° C. to 300° C. In certain embodiments, the process time of the optional annealing treatment may be between 1 min to 10 min. The optional annealing treatment may tune the degree of filling by the sacrificial fill 160 even after the deposition step. For example, the deposition of the sacrificial fill 160 overfills the recesses 155, and the optional annealing treatment may partially removes the sacrificial fill 160 so that the top surface of the sacrificial fill 160 is at or below the level of hard mask 140 (FIGS. 1D and 1C, respectively).

FIGS. 2A and 2B illustrate cross sectional views of an example substrate 100 during an optional annealing process as a part of the damascene process illustrated in FIGS. 1A-1K in accordance with an embodiment. The substrate 100 may have the same features described above referring to FIG. 1A but for illustration purpose, the recesses 155 are illustrated to have a wider pitch.

Another benefit of performing the optional annealing process is the reflow of the sacrificial fill 160. As illustrated in FIG. 2A, the deposition of the sacrificial fill 160 (e.g., FIGS. 1C-1D) may result in an uneven surface of the sacrificial fill 160. Thermal energy may be provided to increase the fluidity of the sacrificial fill 160 to enable reflowing. Accordingly, the optional annealing process may be performed to level the top surface of the sacrificial fill 160 as illustrated in FIG. 2B and/or improve the conformality of the coverage by the sacrificial fill 160.

In certain embodiments, more than one annealing treatments may be performed and/or an annealing treatment may be programmed to have multiple process temperatures or varying process parameters. These embodiments may advantageously enable individually optimizing the partial removal and the reflow of the sacrificial fill 160. In further embodiments, cycles of a deposition step of the sacrificial fill 160 and an annealing treatment may be performed. A cyclic embodiment of the present method may particularly be beneficial to ensure the conformal fill for a substrate having complex features with various pitches and critical dimensions.

FIG. 1F illustrates the substrate after removing the hard mask layer.

After completing the deposition of the sacrificial fill 160 (e.g., FIG. 1C-1E, or 2B), a selective hard mask removal step may be performed as illustrated in FIG. 1F. In various embodiments, the selective hard mask removal may comprise one or more wet etch processes, plasma etch processes, reactive ion etch (RIE) processes, or combinations of these or other etch processes. The etch process may be selective to the sacrificial fill 160, thereby not etching the sidewalls of the interlevel dielectric (ILD) layer 130 and the etch stop layer (ESL) 120 that are protected by the sacrificial fill 160. A top portion of the ILD layer 130 may be removed by the etch process, resulting in a reduced aspect ratio. When using a etch process to remove the hard mask 140, the steps described above in FIGS. 1A-1F (i.e., dielectric etch, deposition of a sacrificial fill, and hard mask removal) may advantageously performed in a single cluster tool equipped with a system to perform the deposition of the sacrificial fill 160. The ability to perform the fill-assisted hard mask removal in the single cluster tool eliminates the need of transport between different tools and may benefit process efficiency.

Alternately, a chemical mechanical planarization (CMP) method may be used to remove the hard mask 140. In this scenario, in addition to protecting the surfaces of the ILD layer 130 and the ESL 120, the sacrificial fill 160 also provides a mechanical support to the features of the substrate and prevents the recess features from collapsing during the CMP. In one embodiments, the sacrificial fill 160 has a hydrophobic characteristic and the CMP uses a polar solvent so as to be selective to the sacrificial fill 160.

Figure 1G:
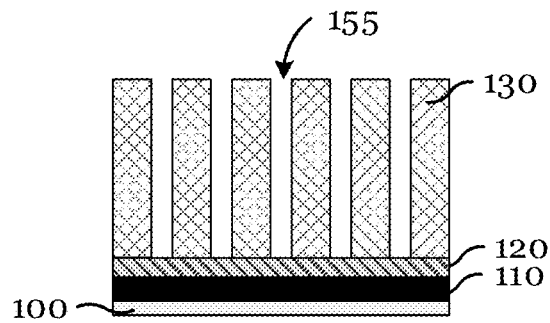

FIG. 1G illustrates the substrate 100 after removing the sacrificial fill 160.

After removing the hard mask 140, the recesses 155 may be recovered by removing the sacrificial fill 160, referred to as a fill removal step in this disclosure. In various embodiments where a thermal decomposition material such as polyurea or polypyrrole is used for the sacrificial fill 160, the fill removal step may advantageously be performed by a thermal strip (i.e., heating the substrate 100). The type and molecular weight of the polymer used for the thermal decomposition material may be selected in consideration of the readiness of the thermal strip. For example, a polymer with a low molecular weight may be removed by the thermal strop at a relatively low temperature, for example below 400° C. The thermal strip may benefit the process efficiency and time because it does not require any etchant, solvent, or complex equipment. In the case of the polyurea, the polyurea is depolymerized to amine and is vaporized when it is heated to around 300° C. or higher. Using a thermal decomposition material having a decomposition temperature below 400° C. for the sacrificial fill 160 is especially beneficial because an adverse effect of the thermal strip on other elements formed on the substrate 100 (e.g., a copper wiring that may be used in the conductive layer 110) can be avoided. Accordingly, in various embodiments, the thermal strip may be performed at a temperature of 400° C. or less, for example, 390° C. In certain embodiments, the temperature of the thermal strip may be between 300° C. to 350° C. A period of time required for depolymerizing the polyurea may be, for example, 5 min or less from the viewpoint of suppressing the thermal damage to the element. Therefore, examples of the heating recipe may include a temperature of 350° C. and a period of time of 5 min or less. An infrared lamp may be used as such a heating method. A heating atmosphere is, for example, an atmosphere of an inert gas such as a nitrogen gas. In one embodiment, a laser may be used to heat the substrate 100 or in another embodiment microwave energy may be used. It will be recognized that other methods may be used to provide thermal energy such that a heat based removal mechanism is achieved. In other embodiments, a ashing technique may be used to the sacrificial fill 160. The ashing technique to remove the sacrificial fill 160 may be advantageous when the thermal strip is not possible due to the stability of the sacrificial fill 160.

Figure 1H:
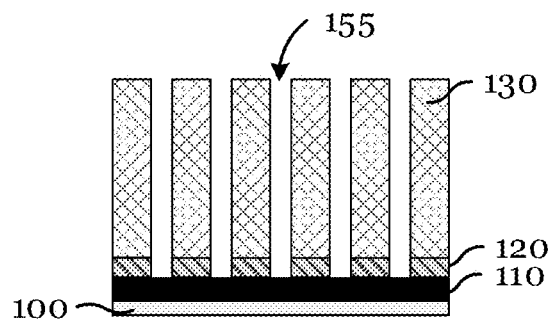

FIG. 1H illustrates the substrate 100 after removing an etch stop layer (ESL) 120 to expose a portion of a conductive layer 110.

In various embodiments, a removal step for the ESL 120 may comprises one or more wet etch processes, plasma etch processes, reactive ion etch (RIE) processes, or combinations of these or other etch processes. The removal of the ESL 120 results in the conductive layer 110 exposed at the bottom of the recesses 155.

Figure 1I:
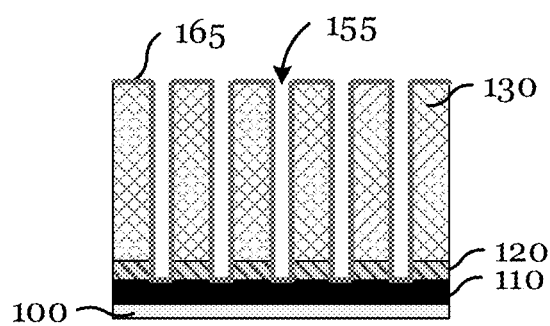

FIG. 1I illustrates the substrate 100 after a diffusion barrier layer deposition.

FIG. 1I illustrates the substrate 100 after a deposition of diffusion barrier layer 165. In certain embodiments, the diffusion barrier layer 165 may comprise tantalum, tantalum nitride, titanium, or titanium nitride. The diffusion barrier layer 165 is intended to prevent the conductive material in the conductive layer 110 from diffusing into other components during fabrication. The diffusion barrier layer 165 may be deposited using deposition techniques such as sputtering, vapor deposition including chemical vapor deposition (CVD), physical vapor deposition (PVD), and atomic layer deposition (ALD), as well as other plasma processes such as plasma enhanced CVD (PECVD), and other processes. In other embodiments, the deposition of the diffusion barrier layer 165 may be skipped, for example, when the conductive material has a characteristic of low diffusivity such as ruthenium.

Figure 1J:
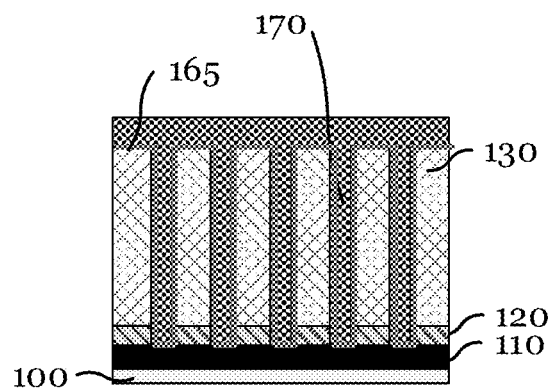

FIG. 1J illustrates the substrate 100 after filling the recesses 155 with a conductive fill 170 (metallization).

The deposition of the conductive fill 170 may be performed by a seed layer deposition of a metal (e.g., copper) using a sputtering or physical vapor deposition (PVD) technique followed by electroplating. In various embodiments, the conductive fill 179 may comprise the same material as the conductive layer 110, but in other embodiments different materials may be used. The fill-assisted hard mask removal in various embodiments may be useful in preventing void formation during depositing the conductive fill 170 in the recesses 155. In general, the hard mask 140 may narrows the openings of the recesses 155 and thereby hinder uniform filling of the recesses 155 by the conductive fill 170, resulting in forming voids in the conductive fill 170. A complete removal of hard mask 140 enabled by the fill-assisted hard mask removal method herein can therefore eliminate or reduce the defect in the conductive fill 170.

Figure 1K:
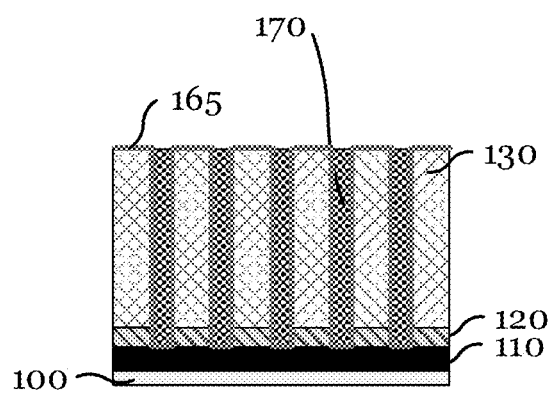

FIG. 1K illustrates the substrate 100 after a planarization process.

After the metallization, an excess amount of the conductive fill 170 is removed by, for example, a chemical mechanical planarization (CMP) method. In various embodiments, with the metallization followed by the planarization process, the recesses 155 filled with the conductive fill 170 becomes the metal interconnects that function as electrical wiring between different conductive layers in the semiconductor device being fabricated.

Figure 3A:
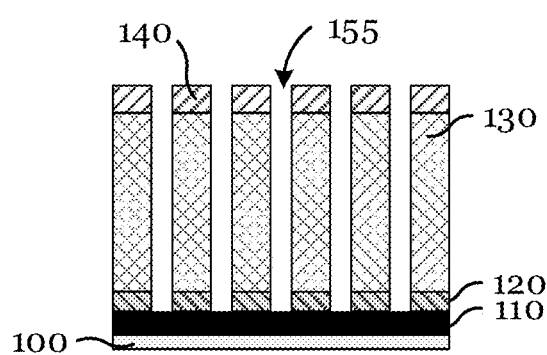
Figure 3B:
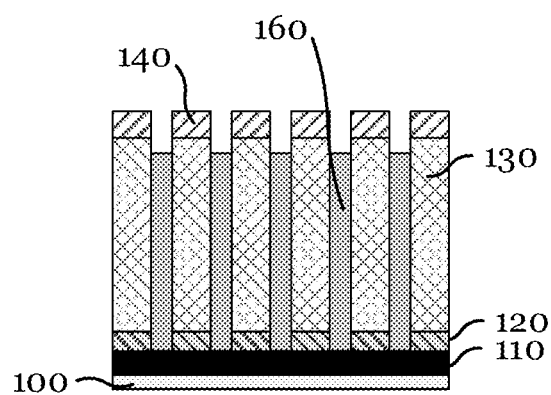
Figure 3C:
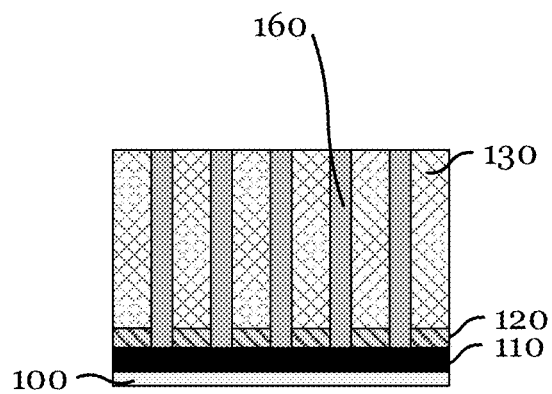

FIGS. 3A-3C illustrate cross sectional views of an example substrate 100 during an example damascene process comprising removing a hard mask layer at various stages in accordance with alternate embodiments.

In the prior embodiments described in FIGS. 1A-1J, the etch stop layer (ESL) 120 is removed (FIG. 1H) after removing the hard mask 140 (FIG. 1F) and the sacrificial fill 160 (FIG. 1G). In the alternate embodiments, the ESL 120 may be removed first. The fill-assisted hard mask removal may start with a dielectric etch (e.g., FIG. 1A-1B). After the dielectric etch, before depositing the sacrificial material 160, the ESL 120 may be removed first as illustrated in FIG. 3A. Accordingly, the conductive layer 110 is exposed at the bottom of the recesses 155 at this stage. The deposition of the sacrificial fill 160 may follow next as illustrated in FIG. 3B. Similar to the prior embodiments, the height of the sacrificial fill 160 may depend on the duration of the deposition process and may be tuned with an optional annealing process. In FIG. 3C, the selective hard mask removal step may be performed as described above. After the selective hard mask removal step, the removal of the sacrificial fill 160 results in the substrate 100 illustrated in FIG. 1H. The rest of the process may follow the same sequence as prior embodiments illustrated in FIGS. 1I-1K. Removing the etch stop layer (ESL) 120 before the hard mask removal may be beneficial in that the hard mask 140 may provide protection to the top surface of the interlevel dielectric (ILD) layer 130 during an etch process to remove the ESL 120.

FIGS. 4A-4C illustrate process flow charts of methods of removing a hard mask in accordance with various embodiments. The process flow can be followed with the figures (FIGS. 1A-1K, 2A-2B, and 3A-3C) discussed above and hence will not be described again.

In FIG. 4A, a process flow 40 starts with etching a dielectric layer of a substrate to form a recess using a hard mask layer as an etch mask (block 400, FIG. 1B). After forming the recess, in one embodiment, an etch stop layer (ESL) may also be removed at this stage (block 405A, FIG. 3A) to expose a portion of a conductive layer comprising a first conductive material of the substrate. Next, a sacrificial fill is deposited to at least partially fill the recess (block 410, e.g., FIG. 1C). An optional annealing process may be performed to reflow or partially remove the sacrificial fill (block 415, e.g., FIGS. 2A-2B). A hard mask removal step is then performed (block 420, e.g., FIG. 1F), followed by a fill removal step (block 430, e.g., FIG. 1G). At this stage, if the ESL is still present, it may be removed to expose the conductive layer in one embodiment (block 405B, FIG. 1H). Lastly, a second conductive material is deposited to fill the recess and provide an electrical connection between the conductive layer and the conductive material, for example as a copper interconnect (block 440, FIG. 1J).

In FIG. 4B, in accordance with another embodiment, a process flow 42 starts with etching a dielectric layer of a substrate to form a recess using a hard mask layer as an etch mask (block 400, FIG. 1B). The substrate comprises a conductive layer having a first conductive material. A sacrificial fill is then deposited to at least partially fill the recess (block 410, e.g., FIG. 1C). A hard mask removal step is then performed by a first chemical mechanical planarization (CMP) process (block 422, e.g., FIG. 1F), followed a fill removal step (block 430, e.g., FIG. 1G). Next, a second conductive material is deposited to fill the recess and provide an electrical connection between the conductive layer and the conductive material, for example as a copper interconnect (block 440, FIG. 1J). Lastly, the surface of the substrate is planarized by a second CMP (block 452, FIG. 1K).

In FIG. 4C, in accordance with yet another embodiment, a process flow 44 starts with positioning a substrate that comprises a dielectric material with a recess and a hard mask over the dielectric material, in a first chamber of a cluster tool (block 404, FIG. 1B). Next in the first chamber, a sacrificial fill comprising a thermally depolymerizable polymer is deposited to at least partially fill the recess (block 414, e.g., FIG. 1C). The substrate is then transferred from the first chamber to a second chamber of the cluster tool by a transfer mechanism of the cluster tool (block 416). Next in the second chamber, the hard mask is removed by a dry etch process to expose the top surfaces of the dielectric material (block 424, e.g., FIG. 1F). A fill removal step is then performed by heating the substrate 100 (block 434, e.g., FIG. 1G). After removing the sacrificial fill, a conductive material is deposited to fill the recess (block 440, FIG. 1J), followed by a CMP process (block 450, FIG. 1K).

FIG. 5 illustrates a system 50 for depositing a sacrificial fill 160 as a part of the fill-assisted hard mask removal (e.g., FIG. 1C, block 410 of FIG. 4A) in accordance with various embodiments.

In FIG. 5, the system 50 for deposition may be a chemical vapor deposition (CVD) system with two gas delivery systems to form a thermal decomposition material used for the sacrificial fill 160. The deposition of the thermal decomposition material may be performed by a vapor deposition polymerization by supplying gases containing the raw material monomers to a substrate 100. The system 50 may comprises a vacuum container 500 for providing a vacuum atmosphere and an exhaust mechanism 540 for exhausting the vacuum container 500 to form the vacuum atmosphere. Raw material supply sources 520A and 525A are configure to accommodate the raw material monomers. For example, isocyanate and amine are stored in liquid forms in the raw material supply sources 520A and 525A, respectively. The raw material monomers may be vaporized by vaporizers 520C and 525C installed in supply pipes 520B and 525B, respectively. Each vapor is introduced into a shower head 530 which is a gas-discharging part. The shower head 530 may comprise a plurality of discharging holes formed in a lower surface thereof and is configured to discharge the raw material monomers separately via the respective discharging holes. The substrate 100 is mounted on a mounting table 510 having a temperature-adjusting mechanism 515.

FIG. 6 illustrates a semiconductor cluster tool 60 for performing a process of semiconductor fabrication comprising the fill-assisted hard mask removal in accordance with various embodiments.

As illustrated in FIG. 6, the fill-assisted hard mask removal may advantageously be performed in a single cluster tool. The semiconductor cluster tool 60 includes a horizontally-extended normal pressure transfer chamber 610 of which an internal atmosphere is set to a normal pressure atmosphere by, for example, a dry nitrogen gas. At the front of the normal pressure transfer chamber 610, loading/unloading ports 600 are disposed, where a substrate 100 to be processed for the fill-assisted hard mask removal may be loaded/unloaded. At a side of the normal pressure transfer chamber 610 opposite to the loading/unloading ports 600, for example, two load lock chambers 620 are arranged side by side. A vacuum transfer chamber 630 is disposed at inner sides of the load lock chambers 620 when viewed from the normal pressure transfer chamber 610 side. Multiple processing chambers may be coupled to the vacuum transfer chamber 630. The substrate 100 is transferred and received between the load lock chambers 620 and different processing chambers by a transfer mechanism of the vacuum transfer chamber 630. In various embodiments, a first processing chamber 640A may be configured to perform a dielectric etch to form a recess in a dielectric layer of the substrate 100 (e.g., FIG. 1B, block 400 in FIG. 4A). A second processing chamber 640B may be configured to perform the deposition of a sacrificial fill 160, for example a thermal decomposition material such as polyurea (e.g., FIG. 1C, block 410 in FIG. 4A). In one embodiment, the first processing chamber 640A may be the CVD apparatus of the system 50 illustrated in FIG. 5. A third processing chamber 640C may be configured to perform a dry etch to remove a hard mask 140 from the substrate 100 (e.g., FIG. 1F, block 420 in FIG. 4A). In certain embodiments, the third processing chamber 640C may further be configured to perform a fill removal step (e.g., FIG. 1G, block 430 in FIG. 4A). It should be noted, however, chamber configurations different from the above embodiments may also be possible. For example, the dielectric etch and the deposition of the sacrificial fill 160 may be performed in one of the processing chambers of the semiconductor cluster tool 60. In addition, other etch/deposition steps (e.g., the etch of the hard mask 140 and the etch of an etch stop layer (ESL) 120) may also be performed in the same processing chamber as other steps of the fill-assisted hard mask removal method. Further, subsequent processes such as metallization, for example ruthenium-based metallization, may be performed in the same cluster tool. The ability to perform the fill-assisted hard mask removal in a single cluster tool may enable the integration of various hard mask materials in back end of line (BEOL) process, including new hard masks such as tungsten based hard masks.

Example embodiments are summarized here. Other embodiments can also be understood from the entirety of the specification as well as the claims filed herein.

Example 1. A method of processing a substrate that includes: etching a recess in the substrate using a metal hard mask layer as an etch mask, the substrate including a dielectric layer over a conductive layer, the conductive layer including a first conductive material, a portion of the metal hard mask layer remaining over top surfaces of the dielectric layer after the etching; depositing a sacrificial fill over the substrate to at least partially fill the recess; removing the remaining portion of the metal hard mask layer to expose the top surfaces, the sacrificial fill protecting the recess when removing the remaining portion of the metal hard mask layer; removing the sacrificial fill from the recess after removing the metal hard mask layer, the removing of the sacrificial fill including exposing a portion of the conductive layer; and depositing a second conductive material to fill the recess, the depositing of the second conductive material providing an electrical connection between the conductive layer and the second conductive material.

Example 2. The method of example 1, where the metal hard mask layer includes silicon, titanium, zirconium, tin, hafnium, tantalum, tungsten, or boron.

Example 3. The method of one of examples 1 or 2, where removing the sacrificial fill includes performing a first etch process to remove the sacrificial fill and a second etch process to remove an etch stop layer disposed between the dielectric layer and the conductive layer.

Example 4. The method of one of examples 1 to 3, further including, after the depositing of the second conductive material, planarizing surfaces of the second conductive material by a chemical mechanical planarization process (CMP).

Example 5. The method of one of examples 1 to 4, where the method is performed in a cluster tool.

Example 6. The method of one of examples 1 to 5, where the sacrificial fill includes a thermal decomposition material.

Example 7. The method of one of examples 1 to 6, further including heating the substrate to reflow or partially remove the sacrificial fill.

Example 8. The method of one of examples 1 to 7, where depositing the sacrificial fill is performed at a temperature between 40° C. to 150° C.

Example 9. The method of one of examples 1 to 8, where the thermal decomposition material has a decomposition temperature range between 200° C. to 350° C., and where removing the sacrificial fill is performed by heating the substrate to a temperature within the decomposition temperature range.

Example 10. The method of one of examples 1 to 9, where removing the metal hard mask layer is performed by a dry etch process selective to the sacrificial fill.

Example 11. The method of one of examples 1 to 9, where the sacrificial fill has a hydrophobic characteristic, and where the removing the metal hard mask layer is performed by a wet etch process using a polar solvent so as to be selective to the sacrificial fill.

Example 12. A method of processing a substrate that includes: etching a recess in the substrate using a hard mask layer as an etch mask, the substrate including a dielectric layer over a conductive layer, the conductive layer including a first conductive material; depositing a sacrificial fill over the substrate to at least partially fill the recess; removing the hard mask layer by a first chemical mechanical planarization process (CMP); removing the sacrificial fill from the recess; depositing a second conductive material to fill the recess, the depositing of the second conductive material providing an electrical connection between the conductive layer and the second conductive material; and planarizing the second conductive material by a second CMP.

Example 13. The method of example 12, where the hard mask layer includes silicon, titanium, zirconium, tin, hafnium, tantalum, tungsten or boron.

Example 14. The method of one of examples 12 or 13, where the sacrificial fill has a hydrophobic characteristic, and where the first CMP applies a polar solvent so as to be selective to the sacrificial fill.

Example 15. The method of one of examples 12 to 14, where the sacrificial fill includes a thermal decomposition material.

Example 16. The method of one of examples 12 to 15, where the thermal decomposition material has a decomposition temperature range between 200° C. to 350° C., and where removing the sacrificial fill is performed by heating the substrate to a temperature within the decomposition temperature range.

Example 17. A cluster tool for processing a substrate that includes: a first processing chamber configured to deposit a sacrificial fill, the first processing chamber including: a first vacuum pumping system; a first gas injection system configured to deliver a deposition gas including a monomer to form a thermally depolymerizable polymer, the thermally depolymerizable polymer being used to form the sacrificial fill; and a first substrate holder configured to hold the substrate; a second processing chamber configured to etch a hard mask including a metal, the second processing chamber including; a second vacuum pumping system; a second gas injection system configured to deliver an etch gas; and a second substrate holder configured to hold the substrate; a transfer mechanism configured to transfer the substrate between the first processing chamber and the second processing chamber; one or more processors; and a memory having a program to be executed in the one or more processors and including instructions to: position the substrate in the first processing chamber, the substrate including a dielectric material with a recess and the hard mask positioned over top surfaces of the dielectric material; in the first processing chamber, deposit the sacrificial fill to at least partially fill the recess; using the transfer mechanism, transfer the substrate from the first processing chamber to the second processing chamber; in the second processing chamber, etch the hard mask by a dry etch process using the etch gas; and in the second processing chamber, heating the substrate to remove the sacrificial fill.

Example 18. The cluster tool of example 17, further including a third processing chamber configured to etch the dielectric material, where the program further includes instructions to: before positioning the substrate in the first processing chamber, in the third processing chamber, etch the dielectric material to form the recess using the hard mask as an etch mask; and using the transfer mechanism, transfer the substrate from the third processing chamber to the first processing chamber.

Example 19. The cluster tool of one of examples 17 or 18, where the second processing chamber is also configured to etch the dielectric material, where the program further includes instructions to: before positioning the substrate in the first processing chamber, in the second processing chamber, etch the dielectric material to form the recess using the hard mask as an etch mask; and using the transfer mechanism, transfer the substrate from the second processing chamber to the first processing chamber.

Example 20. The cluster tool of one of examples 17 to 19, where the program further includes an instruction to: during heating the substrate to remove the sacrificial fill, maintaining a temperature of the substrate between 200° C. to 350° C.

Example 21. A method of processing a substrate that includes: positioning the substrate in a first chamber of a cluster tool, the substrate including a dielectric material with a recess and a hard mask positioned over top surfaces of the dielectric material, the hard mask including a metal; in the first chamber, depositing a sacrificial fill to at least partially fill the recess, the sacrificial fill including a thermally depolymerizable polymer; transferring the substrate, by a transfer mechanism of the cluster tool, from the first chamber to a second chamber of the cluster tool; in the second chamber, etching the hard mask by a dry etch process, the etching exposing the top surfaces of the dielectric material; and heating the substrate to remove the sacrificial fill; depositing a conductive material to fill the recess; and planarizing surfaces of the substrate by a chemical planarization process.

Example 22. The method of example 21, further including, before positioning the substrate in the first chamber, etching the dielectric material to form the recess using the hard mask as an etch mask.

Example 23. The method of one of examples 22, where steps of the method before depositing the conductive material are performed in the cluster tool without exposing to atmosphere.

Example 24. The method of one of examples 21 to 23, further including, during heating the substrate to remove the sacrificial fill, maintaining the temperature of the substrate between 200° C. to 350° C.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate, the method comprising:
   etching a recess in the substrate using a tungsten-based metal hard mask layer as an etch mask, the substrate comprising a dielectric layer over a conductive layer, the conductive layer comprising a first conductive material, a portion of the metal hard mask layer remaining over top surfaces of the dielectric layer after the etching;
   depositing a sacrificial fill over the substrate to at least partially fill the recess;
   removing the remaining portion of the metal hard mask layer to expose the top surfaces, the sacrificial fill protecting the recess when removing the remaining portion of the metal hard mask layer;
   thermally decomposing the sacrificial fill to remove the sacrificial fill from the recess after removing the tungsten-based metal hard mask layer, the removing of the sacrificial fill comprising exposing a portion of the conductive layer; and
   depositing a second conductive material to fill the recess, the depositing of the second conductive material providing an electrical connection between the conductive layer and the second conductive material.

2. The method of claim 1, wherein removing the sacrificial fill comprises performing a first etch process to remove the sacrificial fill and a second etch process to remove an etch stop layer disposed between the dielectric layer and the conductive layer.

3. The method of claim 1, further comprising, after the depositing of the second conductive material, planarizing surfaces of the second conductive material by a chemical mechanical planarization process (CMP).

4. The method of claim 1, wherein the method is performed in a cluster tool.

5. The method of claim 1, further comprising heating the substrate to reflow or partially remove the sacrificial fill.

6. The method of claim 1, wherein depositing the sacrificial fill is performed at a temperature from 40° C. to 150° C.

7. The method of claim 1, wherein the sacrificial fill comprises a thermal decomposition material, wherein the thermal decomposition material has a decomposition temperature range from 200° C. to 350° C., and wherein removing the sacrificial fill is performed by heating the substrate to a temperature within the decomposition temperature range.

8. The method of claim 1, wherein removing the metal hard mask layer is performed by a dry etch process selective to the sacrificial fill.

9. The method of claim 1, wherein the sacrificial fill has a hydrophobic characteristic, and wherein the removing the metal hard mask layer is performed by a wet etch process using a polar solvent so as to be selective to the sacrificial fill.

10. A method of processing a substrate, the method comprising:
    etching a recess in the substrate using a hard mask layer as an etch mask, the substrate comprising a dielectric layer over a conductive layer, the conductive layer comprising a first conductive material;
    depositing a sacrificial fill over the substrate to at least partially fill the recess;
    removing all of the hard mask layer by a first chemical mechanical planarization process (CMP);
    thermally decomposing the sacrificial fill to remove the sacrificial fill from the recess after removing all of the hard mask layer;
    depositing a second conductive material to fill the recess, the depositing of the second conductive material providing an electrical connection between the conductive layer and the second conductive material; and
    planarizing the second conductive material by a second CMP.

11. The method of claim 10, wherein the hard mask layer comprises silicon, titanium, zirconium, tin, hafnium, tantalum, tungsten or boron.

12. The method of claim 10, wherein the sacrificial fill has a hydrophobic characteristic, and wherein the first CMP applies a polar solvent so as to be selective to the sacrificial fill.

13. The method of claim 10, wherein the sacrificial fill comprises a thermal decomposition material.

14. The method of claim 13, wherein the thermal decomposition material has a decomposition temperature range from 200° C. to 350° C., and wherein removing the sacrificial fill is performed by heating the substrate to a temperature within the decomposition temperature range.

15. A method of processing a substrate, the method comprising:
    etching a recess in the substrate using a metal hard mask layer as an etch mask, the substrate comprising a dielectric layer over a conductive layer, the conductive layer comprising a first conductive material, a portion of the metal hard mask layer remaining over top surfaces of the dielectric layer after the etching;
    depositing a sacrificial fill comprising polypyrrole over the substrate to at least partially fill the recess;
    removing the remaining portion of the metal hard mask layer to expose the top surfaces, the sacrificial fill protecting the recess when removing the remaining portion of the metal hard mask layer;
    thermally decomposing the sacrificial fill to remove the sacrificial fill from the recess after removing the metal hard mask layer, the removing of the sacrificial fill comprising exposing a portion of the conductive layer; and
    depositing a second conductive material to fill the recess, the depositing of the second conductive material providing an electrical connection between the conductive layer and the second conductive material.

16. The method of claim 15, wherein the metal hard mask layer comprises silicon, titanium, zirconium, tin, hafnium, tantalum, tungsten, or boron.

17. The method of claim 15, wherein the sacrificial fill has a hydrophobic characteristic, and wherein the removing the metal hard mask layer is performed by a wet etch process using a polar solvent so as to be selective to the sacrificial fill.

18. The method of claim 15, wherein the sacrificial fill comprises a thermal decomposition material, wherein the thermal decomposition material has a decomposition temperature range from 200° C. to 350° C., and wherein removing the sacrificial fill is performed by heating the substrate to a temperature within the decomposition temperature range.

19. The method of claim 15, wherein depositing the sacrificial fill is performed at a temperature from 40° C. to 150° C.

20. The method of claim 15, wherein the method is performed in a cluster tool.

* * * * *